(12) United States Patent
Krieger et al.

(10) Patent No.: US 6,992,323 B2
(45) Date of Patent: Jan. 31, 2006

(54) MEMORY CELL

(75) Inventors: Juri Heinrich Krieger, Brookline, MA (US); Nikolay Fedorovich Yudanov, Brookline, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 122 days.

(21) Appl. No.: 10/486,864

(22) PCT Filed: Aug. 13, 2001

(86) PCT No.: PCT/RU01/00334

§ 371 (c)(1),
(2), (4) Date: Feb. 11, 2004

(87) PCT Pub. No.: WO03/017282

PCT Pub. Date: Feb. 27, 2003

(65) Prior Publication Data

US 2004/0246768 A1    Dec. 9, 2004

(51) Int. Cl.
*H01L 35/24*    (2006.01)

(52) U.S. Cl. .................. 257/40; 257/40; 257/311
(58) Field of Classification Search ........... 257/40, 257/311, 314, 315
See application file for complete search history.

(56) References Cited

U.S. PATENT DOCUMENTS

| | | | |
|---|---|---|---|
| 4,371,883 A | * | 2/1983 | Potember et al. ............ 257/1 |
| 4,652,894 A | | 3/1987 | Potember et al. |
| 4,663,270 A | | 5/1987 | Potember et al. |
| 5,579,199 A | | 11/1996 | Kawamura et al. |
| 5,589,692 A | | 12/1996 | Reed |
| 6,055,180 A | | 4/2000 | Gudesen et al. |
| 6,208,553 B1 | | 3/2001 | Gryko et al. |
| 6,212,093 B1 | | 4/2001 | Lindsey |
| 6,272,038 B1 | | 8/2001 | Clausen et al. |
| 6,314,019 B1 | | 11/2001 | Kuekes et al. |
| 6,320,200 B1 | | 11/2001 | Reed et al. |
| 6,324,091 B1 | | 11/2001 | Gryko et al. |
| 6,348,700 B1 | | 2/2002 | Ellenbogen et al. |
| 6,403,396 B1 | * | 6/2002 | Gudesen et al. ............ 438/99 |

FOREIGN PATENT DOCUMENTS

| | | |
|---|---|---|
| RU | 99101838 | 12/2000 |
| WO | WO 03/017282 A1 | 2/2003 |

OTHER PUBLICATIONS

International Search Report, PCT/RU01/00334, Feb. 21, 2002.

* cited by examiner

*Primary Examiner*—David Nelms
*Assistant Examiner*—Thinh T Nguyen
(74) *Attorney, Agent, or Firm*—Amin & Turocy, LLP

(57) ABSTRACT

Disclosed are memory devices with high data reading and writing speed along with capabilities for long term storage and high information density. The memory devices allow storage of several bits of data, have fast resistance switching and require low operating voltage but at the same time allow to combine its manufacturing technology with the modern semiconductor manufacturing technology. An exemplary implementation option of the memory cell contains two continuous electrodes between which there is a multilayer functional zone consisting of one active layer, one barrier layer and one passive layer.

25 Claims, 10 Drawing Sheets

MEMORY CELL

Figure 1:
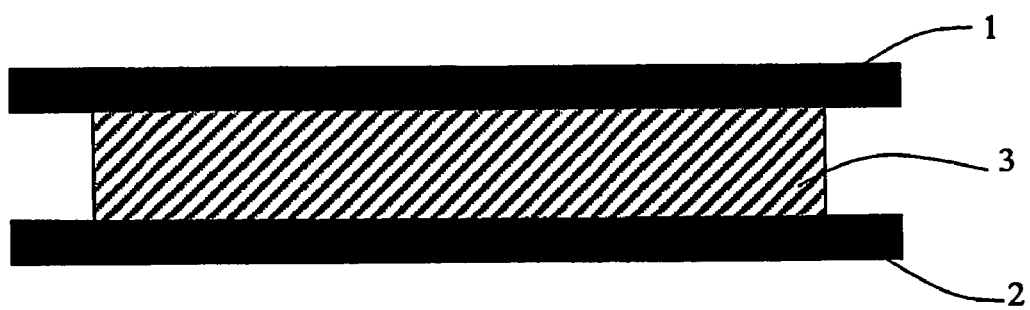

The invention is in the field of Computer Engineering and can be used in memory devices for various computers, in developing associative memory systems, in creating synapses (electric circuit elements with programmable electric resistance) for neuronal nets, in developing data banks with direct access, and in developing a new generation of video and audio equipment.

The Existing Technology

The modern computers use memory devices of various purposes with different characteristics of writing speed, storage time, access time, and reading speed. This substantially complicates computer systems operation, increases computer start up time and complicates the data storage function.

One of the priority tasks in the microelectronics field is to create a universal memory system that would have high write and read speeds along with long storage time and high data density. In addition there is a great need in creating a simple and effective synapse element for neuronal computers. The lack of such an element holds back creation of true neural computers.

At the same time, the potential capabilities of the physical principles on which the modern electronic equipment is based are practically exhausted. Under way now is intensive research work aimed at finding new principles for electronic equipment functioning and manufacturing based on the ideas of molecular electronics with use of molecular materials and supromolecular ensembles.

Articles [1] and [2] contain analysis of possibilities for using the phenomenon of electronic structural instability of small conducting systems as the physics principle on the basis of which it is possible, in particular, to develop memory devices of a new generation. The work discusses the theoretical fundamentals of this phenomenon and analyses the conditions and parameters defining its characteristics. It also contains data on one-dimensional molecular structures as well as discusses the features of the structural instability and analyses possibilities for static and dynamic control of one-dimensional system conductivity.

The above mentioned physical principle opens prospects for designing memory devices based on new mechanisms of data storing and transformation as well as on selecting new materials. It seems quite apparent that the potential possibilities of molecular electronics will be discovered on a greater scale with development of neuronal nets consisting of neurons connected by electro active synapses. Using the molecular electronics methods to develop artificial neurons and various types of sensors connected in a common net will open a way to realize all potential possibilities implied in the neurocomputer ideology, will allow to create an essentially new type of information processing and computer systems and come close to resolving the problem of creating artificial intelligence.

There is a known device containing memory cells that can be used for storing information (see U.S. Pat. No. 6,055,180, International Classification GI IC 11/36, 2000).

The main disadvantage of the known device is that it allows writing information only once. Moreover, the information reading is done by optical methods. Using optical devices makes memory equipment bigger and more complex and also lowers reading reliability because it is difficult to position optical ray. A different writing method described in this patent uses the thermal breakdown effect caused by applying high voltage. A disadvantage of this writing method is that it also allows to record information only once and requires using high voltages of the electric field.

There is a known memory cell with a three-layer structure consisting of two electrodes with a high temperature molecular compound placed between them (see Patent JP 62-260401, International Classification H01C 7/10, C23C14/08, H01B 1/12, 1990, and article [4]). The known memory cell uses the principle based on changing electric resistance of the molecular compound by applying an external electric field. The molecular substance conductivity can be at two very different levels, which allows it to store one bit of information.

The main shortcomings of the known memory cell are the low operation speed caused by long time needed to switch the resistance and the high voltage (about 60 v). These shortcomings significantly limit the usage of this cell in modern electronic devices.

There is also a known memory cell with a three-layer structure consisting of two electrodes between which there is a low temperature molecular compound (see U.S. Pat. No. 465,894, International Classification H01L 29/28, 1987, and article [3]). This memory cell operation is also based on switching electric resistance of the molecular compound by applying an external electric field. However, this device, unlike the one described above, shows characteristically short resistance switch time and low operating voltages.

The main disadvantages of this known technical solution are as follows. First, it is impossible to combine the existing semiconductor manufacturing technology with the suggested memory cell manufacturing technology because the low temperature molecular compounds used in the memory cell are mechanically and, what is more important, thermally, not resistant enough and are able to withstand temperatures only up to 150C. This makes it impossible to use them with the modern semiconductor manufacturing technologies where temperatures up to 400C are used.

Secondly, the known memory cell can store only one bit of information, which prohibits its use in developing devices with high information density.

In addition, the physical characteristics of the materials used make the repeatability of the write-read-erase cycle unsatisfactory.

All memory cells discussed above as well as the memory cells of this type known in literature have one common shortcoming: they can store only one bit of information.

The Invention Disclosure

The invention is based on the problem of creating an essentially new type of memory cell which would be capable of storing several bits of information, would have short resistance switch time and low operating voltages and at the same time would allow to combine its manufacturing technology with that of the modern semiconductors.

This problem is resolved as follows. The memory cell has a three-layer structure consisting of two electrodes with a functional zone between them. This is achieved by making the electrodes out of a metallic and/or semiconductor and/or conductive polymer and/or optically transparent oxide or sulphide material, making the functional zone out of organic, metalorganic and non-organic materials, with different types of active elements built into the materials' molecular and/or crystalline structure, as well as by combining the materials with each other and/or with clusters based on them that change their state or position under influence of an external electric field and/or light radiation.

The described memory cell structure allows creating a memory element with single bit and multi-bit information writing, storing and reading methods. At the same time information is stored as the functional zone resistance value. For a memory cell with single bit storing mode the resistance value has two levels: high (e.g. representing 0) and low (e.g. representing 1), while for a memory cell with multi-bit storing mode the resistance value has several levels corresponding to specific bits of information. For example, for a two-bit cell there are four levels of its resistance, for a four-bit cell—sixteen levels, and so forth. The memory cell is advantageously distinctive of the currently used elements in that it does not require non-interrupted power supply while storing information. The information storage time depends on the memory cell structure, on material used for the functional zone, and on recording mode. The time can vary from several seconds (can be used for dynamic memory) to several years (can be used for long term memory, such as Flash memory).

It is beneficial to implement the memory cell functional zone consisting of an active layer based on organic and metalorganic conjugate polymers with active elements built into the main circuit and/or connected to the circuit or to the plane and/or built into the structure, with the elements forming or not forming a light emitting structure, or of an active layer based on organic, metalorganic and non-organic materials with instilled positive or negative ions, including molecular ions, and/or with instilled clusters based on solid electrolytes or with molecules and/or ions with an electric dipole element, and/or with clusters based on solid polymer and non-organic ferroelectrics, and/or with donor and acceptor molecules, and/or with organic and/or non-organic salts and/or acids and/or water molecules, and/or with molecules which can dissociate in an electric field and/or under light radiation, and/or with non-organic and/or metalorganic and/or organic salts and/or molecules with variable valency of metals or atomic groups they contain. The described implementation of the functional zone allows to create a structure capable of changing the active layer resistance and/or forming high conductivity areas or lines in the active layer under external electric and/or light radiation effect on the memory cell and retaining this state for a long time without applying external electric fields.

For one of the active elements of the memory cell active zone it is quite effective to use molecules and/or ions with electric dipole element and/or with instilled clusters based on solid polymer and non-organic ferroelectrics, to ensure operation of the memory cell with low applied voltage. This is due to the fact that presence of the ferroelecric elements increases the internal electric field intensity and consequently requires application of lower external electric voltage for writing information.

There are interesting prospects in implementing the functional zone as a multilayer structure consisting of several layers with various levels of activity, implemented, for example, out of organic, metalorganic and non-organic materials whose molecular and/or crystalline structure will have instilled active elements and/or clusters based on them, which will change their state under external electric field or light radiation influence, which allows to widen the range and quantity of electric resistance levels therefore increasing the memory data density.

It is advisable to implement the functional zone as multilayer stricture with alternating active, passive and barrier layers, where the passive layers are be made of organic, metalorganic and non-organic materials which are donor and/or acceptor charge carriers and possess ion and/or electron conductivity, while the barrier layer is made of material with high electron conductivity and low ion conductivity, which allows to improve the memory cell stability over time at the same time increasing data density due to increasing the quantity of the stored values of the memory cell electric resistance.

It is preferable to implement the memory cell's electrode in form of several separate elements, for example two or three elements placed above the functional layer, which will permit more precise control the value of the cell electric resistance, therefore improving the quantity of information recording or the memory cell electric resistance analog values precision, as well as allows to decouple the information writing and reading electric circuits.

It is advantageous to implement the memory cell electrode in the form of two elements separated in space by a semiconductor and/or organic light emitting material and forming, for example, either a diode structure, or a photo resistance or a photo sensor element, which allows to decouple the information writing and reading electric circuits electrically or optically.

It is also advantageous to implement the memory cell electrode in the form of three parallel elements separated in space by a semiconductor and/or organic light emitting material and forming, for example, a light emitting structure and a photo resistance or a photo sensor element, which allows to decouple the information writing and reading electric circuits optically.

AN OUTLINE DESCRIPTION OF DRAWINGS

FIGS. 1 through 20 show options of implementing the claimed memory cell:

FIG. 1: A general outline of the claimed memory cell structure with two continuous electrodes and an active functional zone.

Figure 2:
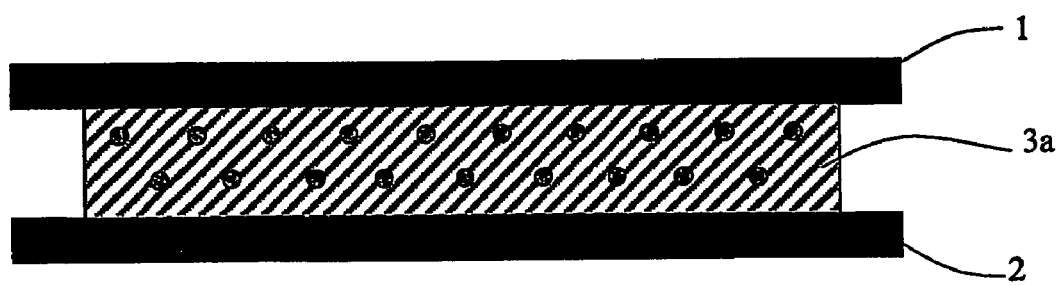
Figure 3:
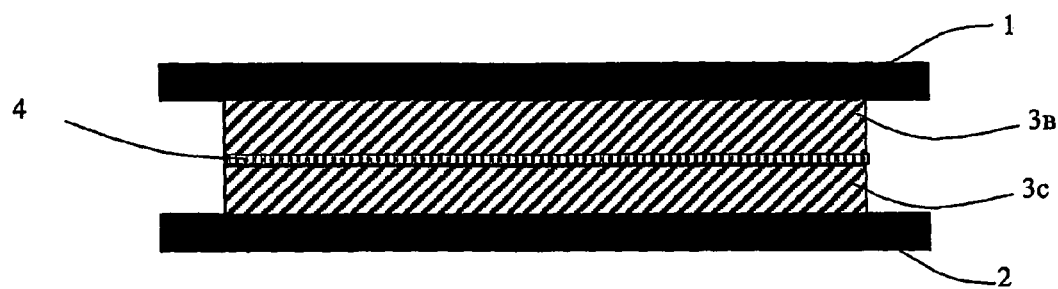
Figure 4:
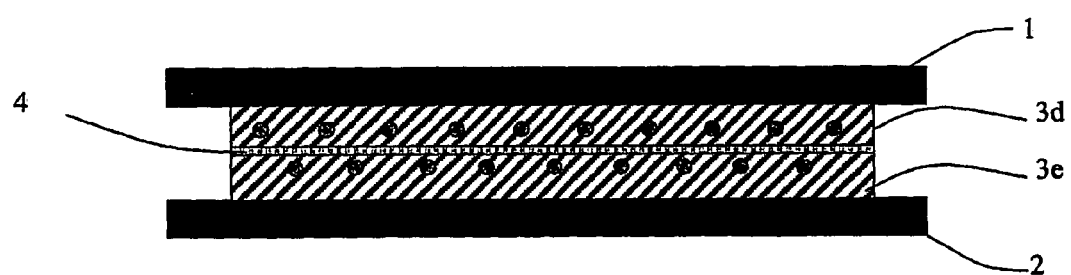
Figure 5:
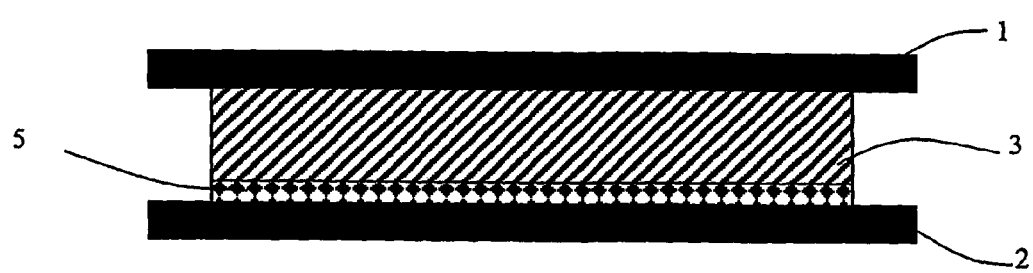
Figure 6:
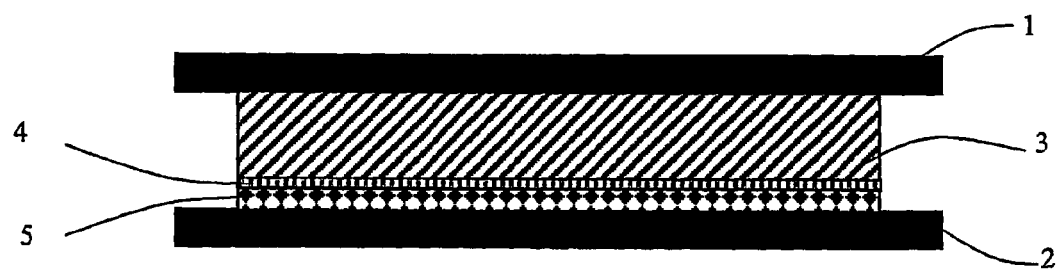
Figure 7:
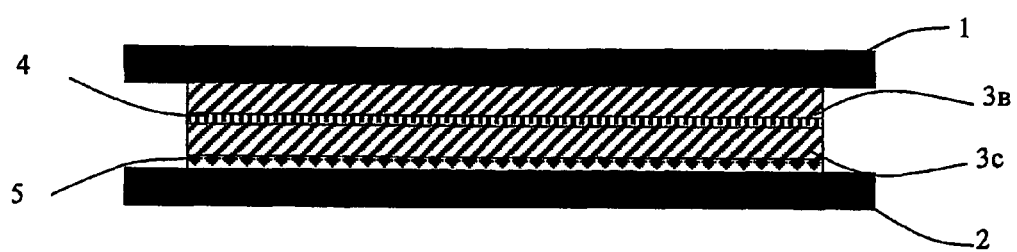

FIG. 2: The claimed memory cell with two continuous electrodes and a single layer functional zone.

FIGS. 3–8: The claimed memory cell with two continuous electrodes and a multilayer functional zone.

Figure 9:
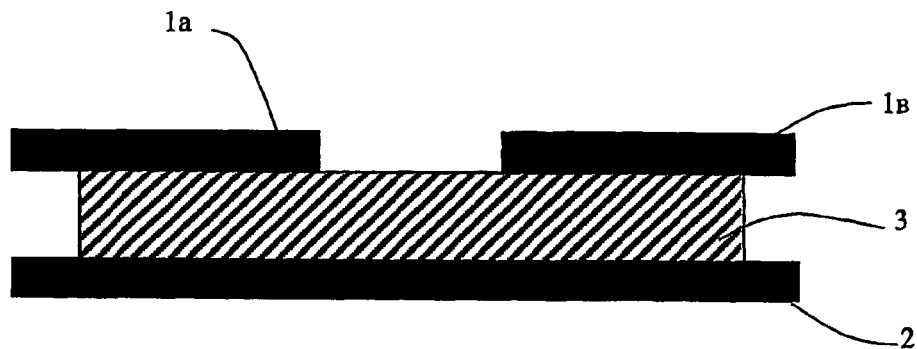

FIG. 9: The claimed memory cell implemented with a single layer functional zone, one continuous electrode and one electrode consisting of two elements.

Figure 10:
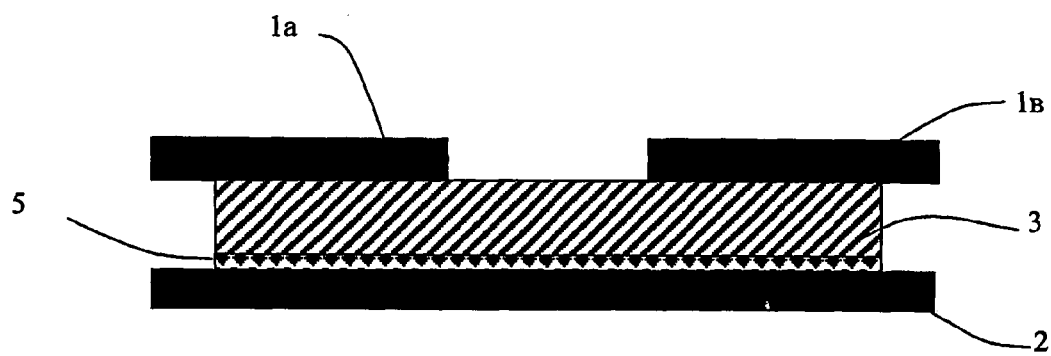
Figure 11:
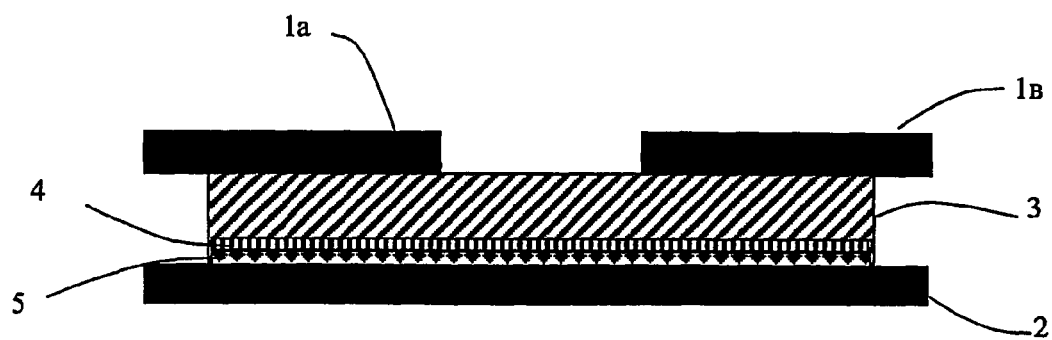

FIGS. 10–11: The claimed memory cell implemented with a multilayer functional zone, one continuous electrode and one electrode consisting of two elements.

Figure 12:
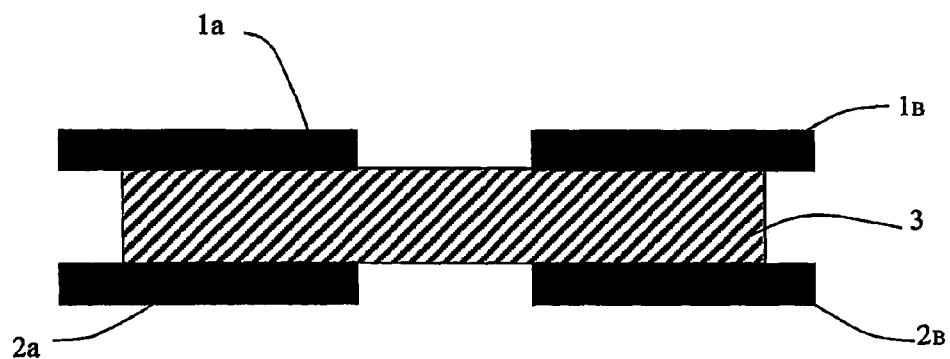

FIG. 12: The claimed memory cell implemented with a single layer functional zone and two electrodes, each consisting of two elements.

Figure 13:
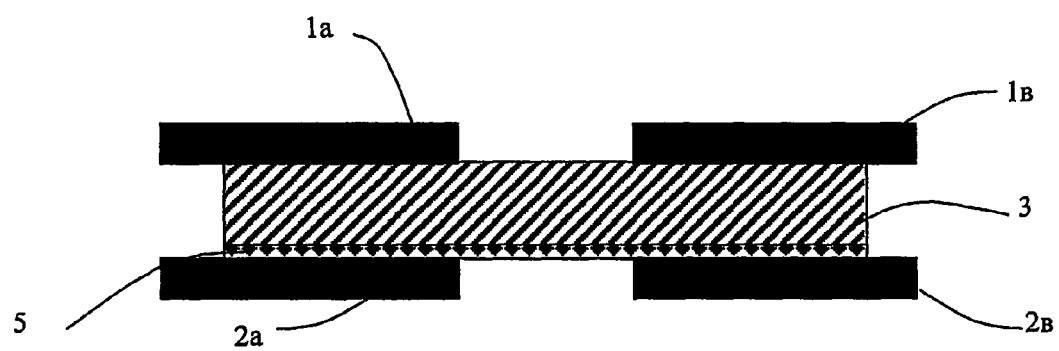
Figure 14:
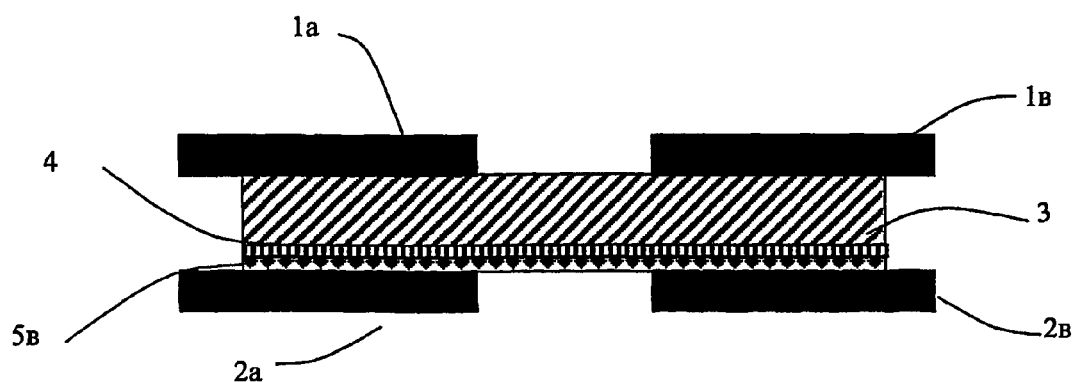

FIGS. 13–14: The claimed memory cell implemented with a multilayer functional zone and two electrodes, each consisting of two elements.

Figure 15:
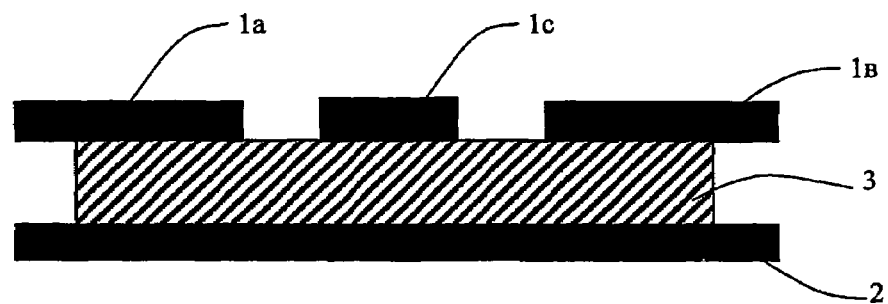

FIG. 15: The claimed memory cell implemented with a single layer functional zone, one continuous electrode and one electrode consisting of three elements.

Figure 16:
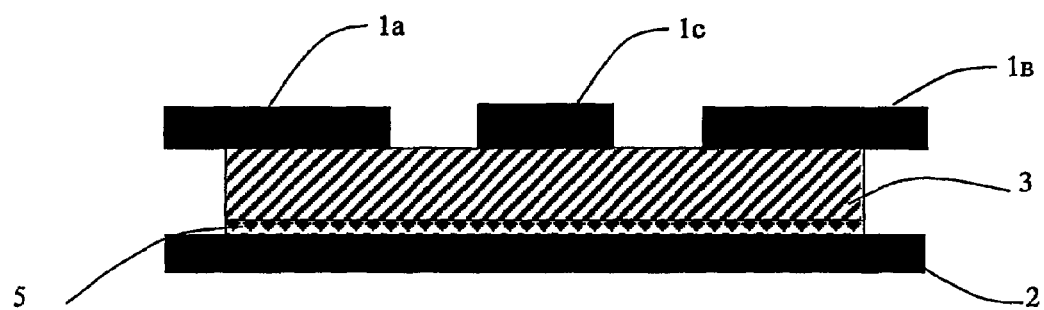
Figure 17:
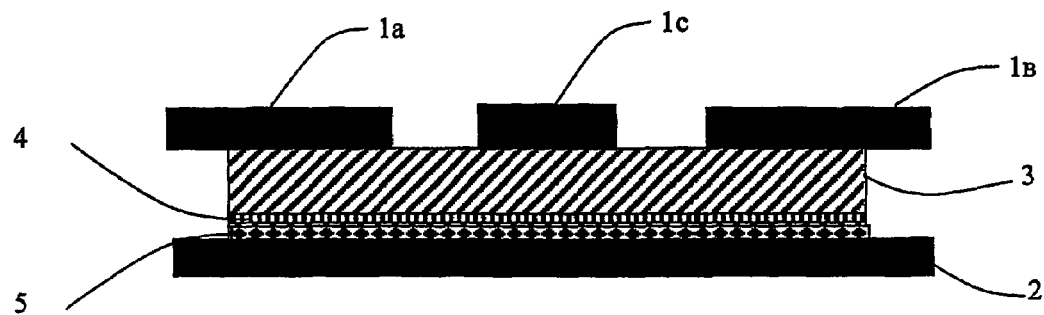

FIGS. 16–17: The claimed memory cell implemented with a multilayer functional zone and two electrodes, each consisting of two elements.

Figure 18:
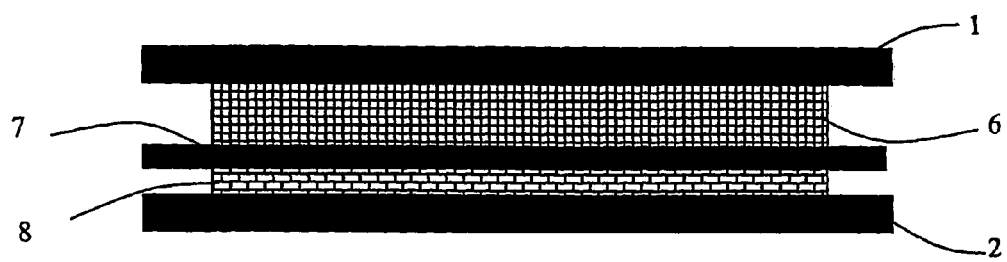
Figure 19:
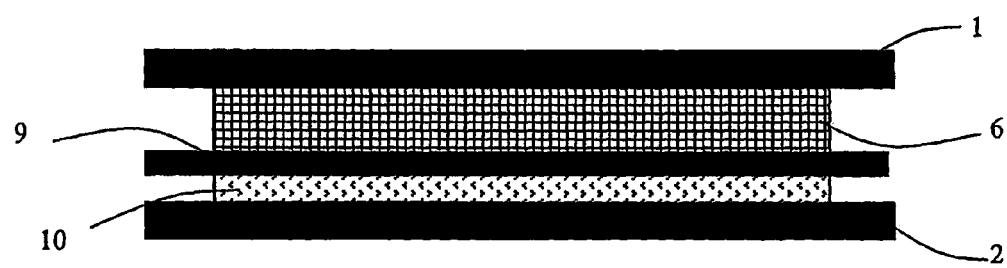
Figure 20:
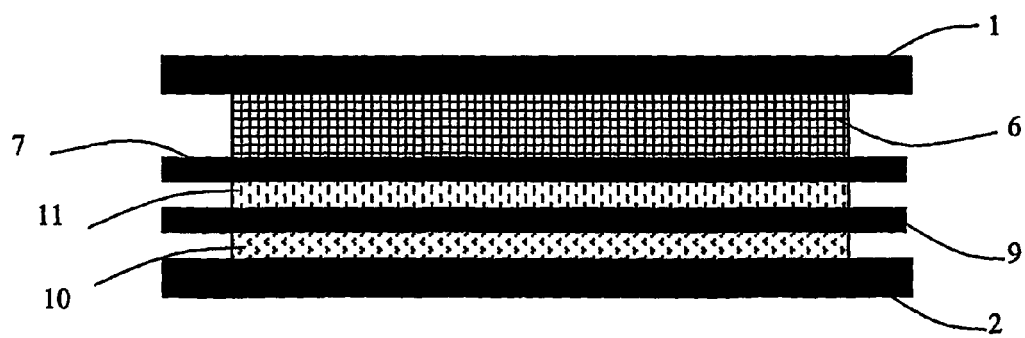

FIGS. 18–20: The claimed memory cell implemented with a multilayer functional zone with elements of electric or optical decoupling.

Figure 21:
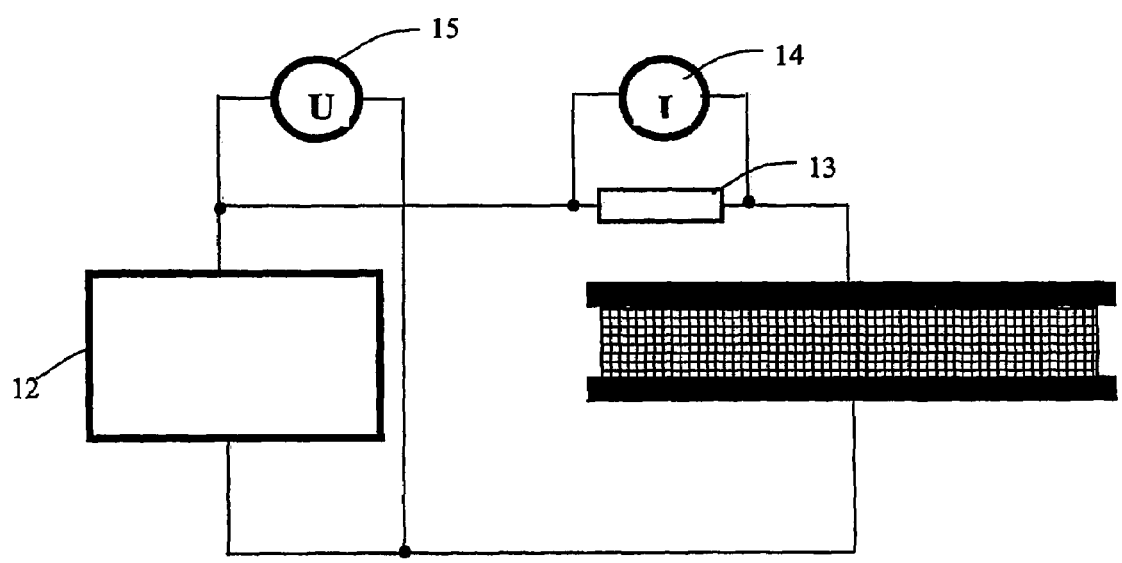

FIG. 21: A diagram explaining the principles of information write, erase and read operations for the claimed memory cell.

Figure 22:
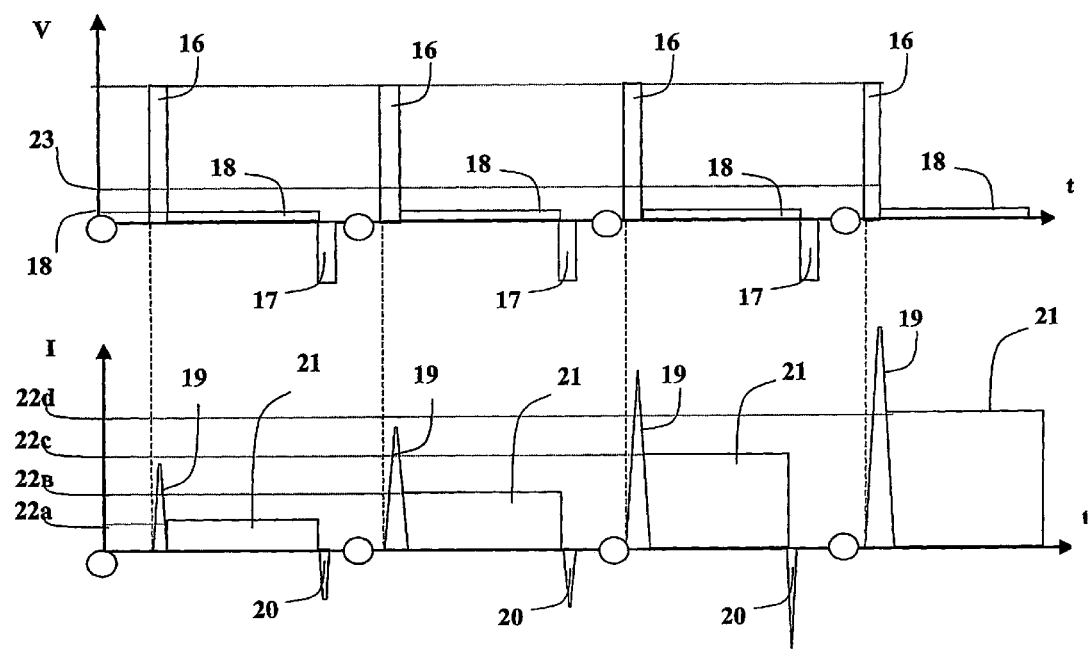

FIG. 22: Voltage and current waveforms of information write, erase and read operations for the claimed memory cell.

THE BEST OPTIONS FOR IMPLEMENTING THE INVENTION

Figure 8:
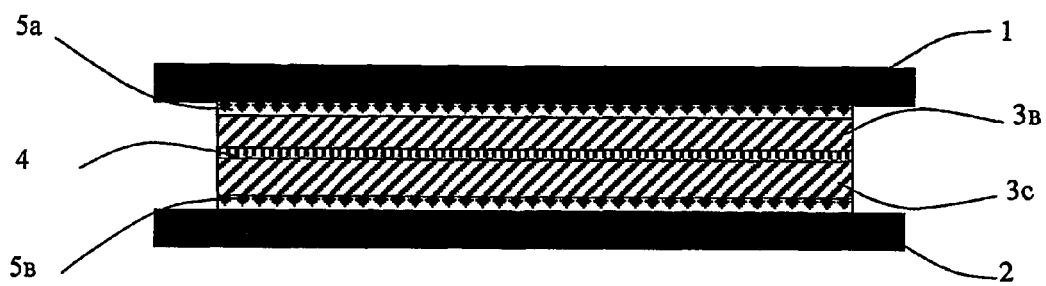

The claimed memory cell (FIGS. 1 through 8) contains two continuous aluminum electrodes 1 and 2 between which there is a single layer functional zone consisting of one active layer which can be doped by ions 3 or electrolyte clusters 3a (FIGS. 1–2) or two active doped layers 3b and 3c (FIG. 3) or two active layers with electrolyte clusters 3d and 3e (FIG. 4) separated by a barrier layer 4. FIGS. 5 through 8 show the multilayer functional zones, consisting of one active layer 3 and one passive layer 5 (FIG. 5) or of one active layer 3, one barrier layer 4 and one passive layer 5 (FIG. 7) or of two active layers 3b and 3c, one barrier layer 4 and two passive layers 5a and 5b (FIG. 8).

In FIGS. 9 through 11 the claimed memory cell contains aluminum electrodes 1 and 2 where the top electrode 1 consists of two elements 1a and 1b. Between the electrodes there is a single layer functional zone, consisting of one active layer 3 (FIG. 9) or a multilayer functional zone consisting of one active layer 3 and one passive layer 5 (FIG. 10) or a multilayer functional zone consisting of one active layer 3, one barrier layer 4 and one passive layer 5 (FIG. 11).

FIGS. 12 through 14 show the claimed memory cell that has aluminum electrodes 1 and 2, each consisting of two elements, 1a and 1b and 2a and 2b, respectively. Between the electrodes there is a single layer functional zone, consisting of one active layer 3 (FIG. 12) or a multilayer functional zone consisting of one active layer 3 and one passive layer 5 (FIG. 13) or a multilayer functional zone consisting of one active layer 3, one barrier layer 4 and one passive layer 5 (FIG. 15).

FIGS. 15 through 17 show the claimed memory cell that has aluminum electrodes 1 and 2, where the top electrode 1 consists of three elements 1a, 1b and 1c. Between the electrodes there is a single layer functional zone, consisting of one active layer 3 (FIG. 15) or a multilayer functional zone consisting of one active layer 3 and one passive layer 5 (FIG. 16) or a multilayer functional zone consisting of one active layer 3, one barrier layer 4 and one passive layer 5 (FIG. 17).

The claimed memory cell in FIGS. 18 through 20 has two continuous electrodes 1 and 2 between which there is a multilayer functional zone 6 which can be implemented similar to the one shown in FIGS. 3 through 8 and equipped with electric decoupling elements: an electrode 7 and a layer 8 made of a semiconductor or organic material forming a diode structure (FIG. 18), or with optical decoupling elements: an additional electrode 9 made of an electro conductive and optically transparent material and a layer 10 made of a semiconductor and/or organic material forming a photo resistance or a photo sensor element (FIG. 19), or with optical decoupling elements: an electrode 7 made of and electro conductive material and two layers 10 and 11 made of semiconductor and/or organic materials, separated with an electrode 9 made of electro conductive and optically transparent material and forming a photodiode or a light emitting structure 11 and a photo resistance or a photo sensor element 10 (FIG. 20).

To explain the principles of write, erase and read operations with the claimed memory cell let us look at the diagram shown in FIG. 21 and containing: a special test generator 12 based on a programmable current generator and providing controllable current level during information recording and constant voltage during reading, and also forming negative pulses during erasing; a memory cell including electrodes 1 and 2 and a functional zone 6 which can be implemented as one of the options shown in FIGS. 1 through 17; a ballast resistance 13 and voltage registering devices 14 and 15 which can be implemented as voltmeters, recorders or oscillographs. The values of the current flowing through the memory cell are obtained by measuring voltage on the ballast resistance 13.

The device operates as follows. The test generator 12 forms a voltage pulse 16 (FIG. 22), which exceeds the threshold value 23. After the writing current pulse value 19 reaches the programmed level, the generator 12 switches to the reading mode and forms reading voltage 18, which is significantly, lower than the threshold value 23. The write operation is considered completed if the controlled writing current value 19 reaches the programmed level, after which the applied voltage is switched off. Based on value 22 (a–d) of the current flowing through the ballast resistance 13 the value of the memory cell resistance can be estimated and these resistance values can be corresponded to a specific bit of information. For example, for a two bit memory cell:

Current 22a corresponds to value (00);
Current 22b corresponds to value (01);
Current 22c corresponds to value (10);
Current 22d corresponds to value (11).

The information storage duration as well as the quantity of the corresponding memory cell electric resistance values depends on the selected functional zone structure and materials used. Erasing of the information is done by the generator 12 by sending a negative voltage pulse 17. The erase operation is considered completed if the controlled erasing current value 20 reaches the preset level and then the applied electric voltage is switched off. After the erase operation the memory cell returns to the initial state with very high resistance of the functional zone 6. For the memory cell structure shown in FIG. 2, before each write operation it is necessary to turn the cell into its initial state, that is erase the recorded information.

A number of options for implementing the claimed memory cell follow below.

Option 1.

The memory cell (FIGS. 1 and 2) has a three-layer structure, consisting of two aluminum electrodes 1 and 2, between which there is polyphenil acetylene 3 or polydiphenil acetylen doped with lithium ions 3a. The memory cell programming is done by applying an electric field pulse greater than the threshold value with simultaneous control of the current flowing through the cell (or the resistance value or the duration and value of the of the applied voltage pulse). A write operation is considered completed if the controlled values (current or resistance) reach the preset level, after which the applied voltage is switched off. Reading of the information is done by applying an electric voltage pulse lower than its value with simultaneous recording of the current value or controlling the resistance value. Erasing takes place when a reverse (negative) electric voltage pulse is applied with control of the current flowing through the cell (or the resistance value or the duration and value of the of the applied voltage pulse). An erase operation is considered completed if the controlled values (current or resistance) reach the preset level, after which the applied negative voltage is switched off.

Option 2.

The memory cell (FIGS. 3 and 4) has a three-layer structure, consisting of two aluminum electrodes 1 and 2, between which there are two layers of polyphenil-acetylene 3b and 3c or two layers 3d and 3e of polydiphenil acetylen doped with lithium ions, separated by lithium nitride 4. The memory cell information programming, reading and erasing are done using the method described in Option 1. This cell is capable of storing information for long time periods.

Option 3.

The memory cell (FIG. 5) has a three-layer structure, consisting of two aluminum electrodes 1 and 2, between which there is a layer of silicon oxide or silicon nitride or polystirole 3 and a passive layer 5 of copper or silver halcogenide. The memory cell information programming, reading and erasing are done using the method described in Option 1. This cell is capable of storing information for long time periods.

Option 4.

The memory cell (FIG. 1) has a three-layer structure, consisting of two aluminum electrodes 1 and 2, between which there is a layer 3 of polyphenil-acetylene or of polydiphenil acetylene doped with molecules of chloranil or tetracyano-quino-dimethane. The memory cell information programming, reading and erasing are done using the method described in Option 1. Fast switching is a characteristic of this cell.

Option 5.

The memory cell (FIG. 5) has a three-layer structure, consisting of two aluminum electrodes 1 and 2, between which there are a polyanyline layer 3 and a passive palladium hydride layer 5. The memory cell information programming, reading and erasing are done using the method described in Option 1. Fast switching is a characteristic of this cell.

Option 6.

The memory cell (FIG. 16) has a three-layer structure, consisting of two aluminum electrodes where one of the electrodes (top) is made of three elements 1a, 1b and 1c. The functional layer 3 consists of polyphenil-acetylene or polydiphenil acetylen and a passive layer 5 made of niobium halcogenide doped with lithium ions or of copper halcogenide. The memory cell information programming is done by applying an electric field pulse to the bottom electrode 2 and to the middle element of the top electrode 1c. The pulse value exceeds the threshold level 23. At the same time the electric resistance between the end elements 1a and 1b of the top electrode is controlled. The write operation is considered completed if the controlled electric resistance values reach the preset level and then the applied electric voltage is switched off. Reading the information from the cell is done by measuring electric resistance between the end elements 1a and 1b of the top electrode using low voltage pulses. Erasing the memory cell is done by applying a reverse (negative) electric field pulse to the bottom electrode 2 and the middle element of the top electrode 1c with simultaneously controlling the resistance between the end elements 1a and 1b of the top electrode. The Erase operation is considered completed when the controlled values (current or resistance) reach the preset level and then the applied negative voltage is switched off. This cell has a greater information density due to decoupling of the write and read circuits, and consequently—a more precise control of the programmed memory cell electric resistance value.

Option 7.

The memory cell (FIG. 20) has a multilayer structure, consisting of four electrodes 1, 2 (made of aluminum), 7 (made of magnesium), and 9 (made of conductive transparent indium oxide). The functional zone 6 corresponds to the functional zone in FIG. 16 and consists of polyphenil-acetylene or polydiphenil acetylen and a passive layer made of niobium halcogenide doped with lithium ions or of copper halcogenide. Layer 11 is made of polyphenil vinylene and forms a light emitting structure. Layer 10 is made of a semiconductor or an organic material and is a light sensor structure. The light emitting (11) and the light sensing (10) layers are separated by the electrode 9 made of conductive and transparent indium oxide. The memory cell information programming and erasing is done using the method described in Option 1, by applying voltage to electrodes 1 and 7. Reading is done by applying a voltage pulse, which is lower than the threshold value to electrodes 1 and 2, with simultaneous control of resistance or voltage between electrodes 2 and 9. This cell has a greater information density due to optical decoupling of the write and read circuits, which provides for a more precise control of the programmed memory cell electric resistance value.

Technical Usability

Prototypes of the claimed memory cell were built and tested with a special test rig using a test generator. Options with continuous aluminum electrodes were built as well as the options using two or three aluminum electrodes with poly-conjugate polymer polydiphenil acetylen doped with lithium ions placed between the electrodes. The bottom aluminum layer was sprayed on a glass substrate while the top electrode was sprayed on the poly-conjugate polymer layer. The poly-conjugate polymer used withstands heating to 400C, which allows manufacturing the claimed memory cells together with manufacturing semiconductor devices. The tests proved the possibility of creating a memory cell capable of storing multi-bit digital information as well as of forming analog values of its electric resistance levels, thus also permitting its usage for active synapses in neuronal nets. Therefore the claimed memory cell can be considered an essentially new device for storing information in either digital or analog form

LITERATURE

1. Krieger Ju. H. Molecular electronics: Current state and future trends. J. Structure. Chemistry, (1993), v.34, p. 896–904. Ю.Г.КригерМолекулярная электроник а Состояние и лути развития Журнал струк турной химии 1993, Т.34, N6, c.75–85.)
2. Krieger Ju. H. Structural instability of one-dimensional systems as a physical principle underlying the functioning of molecular electronics devices (Review) Journal of Structural Chemistry. 1999, V.40, No. 4, pp. 594–619.

Ю.Г. КригерСтруктурная неустойчивость одном ерных систем как основа физического принц ипа функционирования устройств молекулярной электроники. Журнал Структурной химии 1999. Т.40, No. 4. c. 734–767.)

3. R. S. Potember, T. O. Poehler. Electrical switching and memory phenomena in Cu-TCNQ thin films. AppL Phys. Letters, 1979, v.34, No. 6, pp. 405–407.

What is claimed is:

1. A memory cell with a three-layer structure consisting of two electrodes with a functional zone between them, distinctive in that the electrodes are made of at least one of metal, semiconductor, conductive polymer, optically conductive oxides, and optically conductive sulphides, while the functional zone is made of organic, metalorganic and non-organic materials, and in at least one of the functional zone molecular structure and crystalline structure instilled are various types of active elements as well as at least one of combinations of the active elements and clusters based on the active elements, which change their state or position under influence of at least one of external electric field and light radiation, distinctive in that the electrode is implemented as several elements, separated from each other in space and electrically.

2. A memory cell as in 1, distinctive in that the electrode consists of two or three separate elements placed on top of the functional zone.

3. A memory cell as in 1, distinctive in that the functional zone is implemented as an active layer based on organic, metalorganic and non-organic materials with instilled positive or negative ions.

4. A memory cell as in 1, distinctive in that the functional zone is implemented as an active layer based on composites of organic, metalorganic and non-organic materials with instilled clusters based on solid electrolytes.

5. A memory cell as in 1, distinctive in that the functional zone is implemented as an active layer based on composites or organic, metalorganic and non-organic materials with instilled clusters based on solid polymer and non-organic ferroelectrics.

6. A memory cell as in 1, distinctive in that the functional zone is implemented as an active layer based on organic, metalorganic and non-organic materials with instilled donor and acceptor molecules.

7. A memory cell as in 1, distinctive in that the functional zone is implemented as an active layer based on organic, metalorganic and non-organic materials instilled with at least one of organic salts, non-organic salts, acids, and water molecules.

8. A memory cell as in 1, distinctive in that the functional zone is implemented as an active layer based on organic, metalorganic and non-organic materials with instilled molecules able to dissociate in at least one of an electric field and and/or under light radiation.

9. A memory cell as in 1, distinctive in that the functional zone is implemented as an active layer based on organic, metalorganic and non-organic materials instilled with at least one of non-organic salts, metalorganic salts organic salts, molecules with variable valency of metals, and atomic groups contained in the molecules with variable valency of metals.

10. A memory cell as in 1, distinctive in that the functional zone is implemented as an active layer based on organic and metalorganic conjugate polymers with active elements at least one of built into a main circuit, connected to the main circuit and built into the three-layer structure, with the active elements forming or not forming a light emitting structure.

11. A memory cell as in 1, distinctive in that the functional zone is implemented as a multilayer structure consisting of several different active layers made of organic, metalorganic and non-organic materials, where into at least one of the molecular and crystalline structure instilled are at least one of active elements and clusters based on them, which change at least one of their states and and/or positions under influence of at least one of an external electric field and a light radiation.

12. A memory cell as in 11, distinctive in that for the functional zone a multilayer structure is used consisting of several active, passive, barrier, light emitting and light sensing layers separated between each other by electrodes of different active layers made of organic, metalorganic and non-organic materials where into at least one of the molecular and crystalline structure instilled are at least one of active elements and element and/or clusters based on them, changing at least one of their states and positions under influence of at least one of an external electric field and a light radiation.

13. A memory cell as in 12, distinctive in that for the functional zone a multilayer structure is used, consisting of alternating active and passive layers with elements of optical or electric decoupling.

14. A memory cell as in 12, distinctive in that the passive layers are made of organic, metalorganic and non-organic materials, which are at least one of donors and acceptors of charge carriers and are at least one of ion and electronic conductors.

15. A memory cell as in 12, distinctive in that the barrier layer is made of materials with high electronic conductivity and low ion conductivity.

16. A memory cell as in 12, distinctive in that for the functional zone a two-layer structure is used, consisting of an active layer and a passive layer.

17. A memory cell as in 12, distinctive in that for the functional zone a two-layer structure is used, where one layer is made of metalorganic and non-organic materials and has high electronic and low ion conductivity, while the other layer is passive.

18. A memory cell as in 12, distinctive in that for the functional zone a three-layer structure is used, with outer active layers and a barrier layer placed between them.

19. A memory cell as in 12, distinctive in that for the functional zone a four-layer structure is used, with two active layers, separated by the third, barrier layer, where the fourth layer is passive.

20. A memory cell as in 12, distinctive in that for the functional zone a five-layer structure is used, with two outer passive layers and two active layers placed between the passive ones and separated by the fifth, barrier layer.

21. A memory cell as in 13, distinctive in that the electric decoupling element is implemented as an additional electrode made of an electro conductive material and a layer of at least one of semiconductor and organic material forming a diode structure.

22. A memory cell as in 13, distinctive in that the electric decoupling elements are implemented as an additional electrode made of an electro conductive and optically transparent material and a layer of at least one of semiconductor and organic material forming either a photo resistance or a photo sensor element.

23. A memory cell as in 13, distinctive in that the electric decoupling element is implemented as an additional electrode made of an electro conductive material two layers of at least one of semiconductor and and/or organic materials separated by a second additional electrode made of an electro conductive and optically transparent material and forming a photodiode or a light emitting structure and a photo resistance or a photo sensor element.

24. A memory cell with a three-layer structure consisting of two electrodes with a functional zone between them, distinctive in that the electrodes are made of at least one of metal, semiconductor, conductive polymer, optically conductive oxides, and optically conductive sulphides, while the functional zone is made of organic, metalorganic and non-organic materials, and in at least one of the functional zone molecular structure and crystalline structure instilled are various types of active elements as well as at least one of combinations of the active elements and clusters based on the active elements, which change their state or position under influence of at least one of external electric field and light radiation, distinctive in that the functional zone is implemented as an active layer based on organic, metalorganic and non-organic materials instilled with at least one of molecules with electric dipole moment and ions with electric dipole moment.

25. A memory cell with a three-layer structure consisting of two electrodes with a functional zone between them, distinctive in that the electrodes are made of at least one of metal, semiconductor, conductive polymer, optically conductive oxides, and optically conductive sulphides, while the functional zone is made of organic, metalorganic and non-organic materials, and in at least one of the functional zone molecular structure and crystalline structure instilled are various types of active elements as well as at least one of combinations of the active elements and clusters based on the active elements, which change their state or position under influence of at least one of external electric field and light radiation, distinctive in that the functional zone is implemented as an active layer based on organic, metalorganic and non-organic materials with instilled molecules able to dissociate in at least one of an electric field and under light radiation.

* * * * *